US008243756B2

(12) United States Patent
Chakrabarti et al.

(10) Patent No.: US 8,243,756 B2
(45) Date of Patent: Aug. 14, 2012

(54) METHODS, COMPUTER PROGRAM PRODUCTS AND APPARATUS PROVIDING IMPROVED QUANTIZATION

(75) Inventors: Arnab Chakrabarti, Bellevue, WA (US); Ashutosh Sabharwal, Houston, TX (US); Behnaam Aazhang, Houston, TX (US); Jorma Lilleberg, Oulu (FI)

(73) Assignee: Nokia Corporation, Espoo (FI)

( * ) Notice: Subject to any disclaimer, the term of this patent is extended or adjusted under 35 U.S.C. 154(b) by 1215 days.

(21) Appl. No.: 11/827,717

(22) Filed: Jul. 12, 2007

(65) Prior Publication Data

US 2009/0016415 A1    Jan. 15, 2009

(51) Int. Cl.
- H04J 3/18 (2006.01)
- H04B 7/02 (2006.01)
- H04L 1/02 (2006.01)
- H04L 27/18 (2006.01)

(52) U.S. Cl. .................... 370/477; 375/279; 375/267

(58) Field of Classification Search .................. None
See application file for complete search history.

(56) References Cited

U.S. PATENT DOCUMENTS

| 5,832,118 A * | 11/1998 | Kim ............................... 382/224 |
| 2006/0133669 A1 * | 6/2006 | Manbeck et al. ............. 382/162 |
| 2007/0217541 A1 * | 9/2007 | Liu et al. ...................... 375/279 |
| 2008/0260062 A1 * | 10/2008 | Imamura ...................... 375/267 |

OTHER PUBLICATIONS

Wyner, A. et al., "The Rate-Distortion Function for Source Coding With Side Information at the Decoder", Jan. 1976, pp. 1-10, IEEE Transactions on Information Theory, vol. 22, No. 1.

Wyner, A.D., "The Rate-Distortion Function for Source Coding With Side Information at the Decoder-II: General Sources", 1978, pp. 60-80, Information and Control, vol. 38.

Gallager, R.G., "Information Theory and Reliable Communication", 1968, John Wiley and Sons, 1 page, Fig. 9.7.3.

Marco, D. et al., "Low-Resolution Scalar Quantization for Gaussian Sources and Squared Error", Apr. 2006, pp. 1689-1697, IEEE Transactions on Information Theory, vol. 52, No. 4.

Cover, T. et al., "Elements of Information Theory", 1991, John Wiley and Sons, 1 page, Theorem 2.7.4.

Chakrabarti, A. et al., "Half-Duplex Estimate-and-Forward Relaying: Bounds and Code Design", Jul. 9-14, 2006, pp. 1239-1243, Proc. of ISIT.

"LdpcOpt—a fast and accurate degree distribution optimizer for ldpc code ensembles", Internet document http://lthcwww.epfl.ch/research/dlpcopt/, retrieved from Internet Jun. 18, 2007.

Katz, Michael et al., "Relaying Protocols for Two Colocated Users", IEEE Transactions on Information Theory, vol. 52, No. 6, Jun. 2006, pp. 2329-2344, XP002517149.

Steiner, Avi et al., "Single-User Broadcasting Protocols Over a Two-Hop Relay Fading Channel", IEEE Transactions on Information Theory, vol. 52, No. 11, Nov. 2006, pp. 4821-4838, XP002517150.

(Continued)

*Primary Examiner* — Gary Mui
*Assistant Examiner* — Lonnie Sweet
(74) *Attorney, Agent, or Firm* — Harrington & Smith

(57) ABSTRACT

Thus, the exemplary embodiments of the invention describe methods, computer program products and apparatus that provide improved quantization, as may be useful within the context of a communication system (e.g., a wireless communication system) that has a relay node. In one non-limiting, exemplary embodiment, a method includes: receiving a transmission having source data from an information source; determining an estimate of the source data using a quantization technique based on maximizing data throughput; and transmitting a message including the determined estimate towards an information destination.

29 Claims, 8 Drawing Sheets

OTHER PUBLICATIONS

Khojastepour, Mohammad Ali et al., "Throughput Maximization in Multiple Antenna Communication Systems Through Quantized Rate Control", Conference on Signals, Systems and Computers, Oct. 2005, pp. 638-642, XP002517151.

Li, Jing et al., "Slepian-Wolf Cooperation: A Practical and Efficient Compress-And-Forward Relay Scheme", Proceeding of $43^{rd}$ Annual Allerton Conference on Communication, Control, and Computing, Sep. 2005, whole document, XP002517153.

* cited by examiner

METHODS, COMPUTER PROGRAM PRODUCTS AND APPARATUS PROVIDING IMPROVED QUANTIZATION

TECHNICAL FIELD

The exemplary embodiments of this invention relate generally to communication systems and, more specifically, relate to quantization techniques for communication systems.

BACKGROUND

The following abbreviations are utilized herein:
3G third generation of GSM-based mobile networks
ASIC application specific integrated circuit
AWGN additive white Gaussian noise
BC broadcast
BER bit error rate
BPSK binary phase-shift keying
BS base station
CDMA code division multiple access
CF compress-and-forward
CSI channel-state information
DF decode-and-forward
DSP digital signal processor
$E_b/N_0$ energy per bit per noise power spectral density
EF estimate-and-forward
E-UTRAN evolved universal terrestrial radio access network
FDMA frequency division multiple access
FPGA field programmable gate array
IEEE institute of electrical and electronics engineers
LDPC low-density parity-check
LLR log-likelihood ratio
MA multiple access
Node B base station
OFDMA orthogonal frequency division multiple access
p.d.f. probability density function
QAM quadrature amplitude modulation
QPSK quadrature phase-shift keying
SFN single frequency network
SNR signal to noise ratio
SQ scalar quantization
TDMA time division multiple access
UE user equipment, such as a mobile station or mobile terminal
VQ vector quantization
WAN wide area network
WCDMA wideband code division multiple access
WiMAX worldwide interoperability for microwave access (IEEE 802.16 standard)
WLAN wireless local area network In communication systems, relay nodes or devices, also referred to as repeaters, may be used in a variety of ways. Generally, a relay device is configured to receive and transmit, or re-transmit, a signal. Three types of relay devices are briefly considered here. A first type of relay receives a signal, amplifies the signal and re-transmits the amplified signal. The first type of relay is relatively transparent and primarily repeats the input signal. A second type of relay receives the signal, decodes the input signal, possibly performs some processing on the decoded data, re-encodes the data and transmits the re-encoded data. The second type of relay acts in a manner similar to a BS. Note that the second type is generally more complex than the first type as it processes the input signal in some fashion. A third type of relay is one that falls between the first and second types. For example, a third type relay may receive an input signal and regularly re-transmit only a portion of the input signal. As another example, a third type relay may receive an input signal, process the input signal to obtain information about the received signal and transmit the obtained information. As an example, the information may be a reduced or simplified version of the input signal (e.g., a digitized or quantized version of the input signal).

One example of a third type relay utilizes a CF (i.e., EF) relay protocol, where the relay quantizes its received signal and forwards the quantized output to the destination.

In a wireless communication system having an intermediate relay node, if the relay node is unable to decode a received signal reliably, it may form an estimate and forward the estimate to the destination. Generally, this estimate may be obtained by quantization or compression. Conventional quantization techniques include distortion-minimizing quantization and non-optimized uniform quantization (e.g., analog-to-digital converters).

SUMMARY

In an exemplary aspect of the invention, a method includes: receiving a transmission having source data from an information source; determining an estimate of the source data using a quantization technique based on maximizing data throughput; and transmitting a message including the determined estimate towards an information destination.

In another exemplary aspect of the invention, a computer program product includes program instructions embodied on a tangible computer-readable medium. Execution of the program instructions results in operations including: receiving a transmission having source data from an information source; determining an estimate of the source data using a quantization technique based on maximizing data throughput; and transmitting a message including the determined estimate towards an information destination.

In a further exemplary aspect of the invention, an electronic device includes: a receiver configured to receive a transmission having source data from a first device; a data processor configured to determine an estimate of the source data using a quantization technique based on maximizing data throughput; and a transmitter configured to transmit a message including the determined estimate towards a second device.

In another exemplary aspect of the invention, an electronic device includes: means for receiving a transmission having source data from an information source; means for determining an estimate of the source data using a quantization technique based on maximizing data throughput; and means for transmitting a message including the determined estimate towards an information destination.

BRIEF DESCRIPTION OF THE DRAWINGS

The foregoing and other aspects of embodiments of this invention are made more evident in the following Detailed Description, when read in conjunction with the attached Drawing Figures, wherein.

DETAILED DESCRIPTION

1—Introduction

Figure 1:
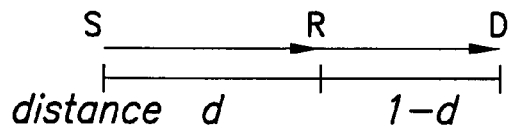
FIG. 1 depicts an exemplary three-terminal relay channel within which the exemplary embodiments of the invention may be practiced.

The three-terminal relay channel (e.g., FIG. 1) is a common unit of cooperative communication. The CF (EF) relay protocol, where the relay forwards an estimate of its received signal (formed by quantization or compression) to the destination, yields the best achievable rates when the relay-to-destination link is strong. The achievable rate of the CF protocol on a Gaussian relay channel is based on Wyner-Ziv coding at the relay. See A. Wyner and J. Ziv, "The rate-distortion function for source coding with side information at the decoder," IEEE Trans. Inform. Theory, vol. 22, pp. 1-10, January 1976. On a Gaussian relay channel with Gaussian inputs, Wyner-Ziv coding is employed to minimize $L_2$ distortion. See A. D. Wyner, "The rate-distortion function for source coding with side information at the decoder-ii: General sources," Information and Control, vol. 38, pp. 60-80, 1978. In contrast, practical systems use finite-order modulation such as BPSK, QPSK, or QAM for channel inputs. In addition, unlike information-theoretic quantizers, practical quantizers are mostly regular with non-overlapping quantization bins and fixed reconstruction points for each bin. These differences raise the question whether $L_2$ distortion is the right quantity to minimize in a practical CF relay system. The answer is negative. Below, an example is presented where, among several scalar quantizers satisfying the rate constraint, the one with the worst average distortion outperforms all others. It is demonstrated that viewing the quantizer as a distortion-minimizing device at the relay is misleading, since the goal is not to convey the received signal with high fidelity, but to convey as much source information through the relay as possible. Drawing insights from these observations, a new quantizer design technique based on mutual information maximization subject to a rate constraint is presented. The technique is illustrated with an example. Finally, using exemplary LDPC codes of blocklength $10^5$, BPSK modulation, and exemplary scalar quantizers designed with the proposed method, performance less than 0.9 dB from the achievable rate at a BER of $10^{-4}$ is demonstrated.

The remainder of this report is organized as follows. First, in Section 2 the framework in which the results are developed is described. Next, the information theoretic EF relaying scheme is discussed in Section 3, and guidelines are derived from it. In Section 4, the suboptimality of distortion minimization as a criterion for quantizer design is shown, and a new quantizer design technique is presented, which is illustrated with an example. Finally, exemplary simulation results are discussed in Section 5.

2—System Description 2.1—The Relay Channel Model

Figure 2:
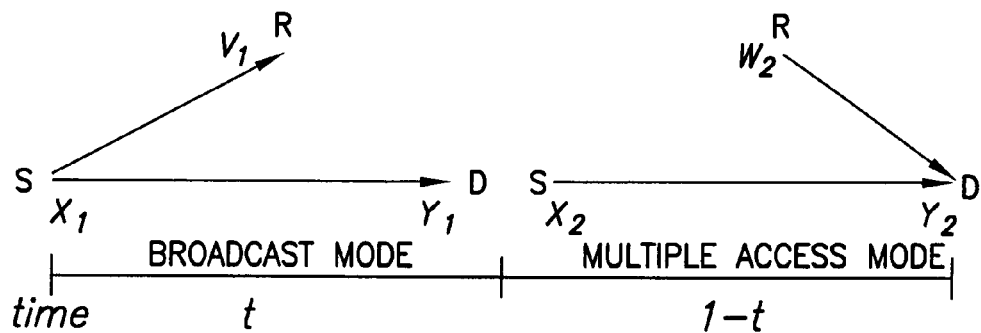
FIG. 2 illustrates the broadcast (BC) and multiple access (MA) modes of the exemplary three-terminal relay channel shown in FIG. 1.

In the relay channel (see FIG. 1), the source (S) sends data to the destination (D), and in doing so it is aided by the relay (R), which does not have data of its own to transmit. For convenience, assume the use of a half-duplex relay channel, where the relay cannot transmit and receive simultaneously in the same band. Without loss of generality, further assume that half-duplexing is performed in time, so that communication takes place over two slots of time fractions t and $t'=(1-t)$. In the first slot, S transmits a signal, which is corrupted and received by R and D. This is referred to as the BC (broadcast) mode of communication. In the second slot, both S and R transmit to D. This is referred to as the MA (multiple access) mode. These two modes are depicted in FIG. 2.

Note that while discussed with reference to a half-duplex relay channel, the exemplary embodiments of the invention are not limited for use with only this one type of relay channel. It should be appreciated that the exemplary embodiments of the invention may be utilized in conjunction with other types of relay channels, such as a full duplex relay channel, as a non-limiting example.

General information theoretic results are discussed under the standard assumption that the channel is represented by the conditional probability of the outputs given the inputs. The terms X, V, W and Y denote the source transmitted signal, the relay received signal, the relay transmitted signal, and the destination received signal, respectively (see FIG. 2). $\hat{V}$ denotes an estimate of V that is forwarded to the destination. As a non-limiting example, $\hat{V}$ may comprise a quantization of V. Subscripts 1 and 2 denote BC and MA modes, respectively. The terms S, R, and D denote the source, the relay and the destination, respectively, with SR channel, for instance, denoting the source-to-relay channel.

For the purpose of code construction, focus on real AWGN channels with perfect global channel state information (CSI) at all three nodes. An extension to complex circularly symmetric AWGN is straightforward. Moreover, the design remains unchanged if there are fading channels with CSI at the transmitters. Nodes are assumed to be synchronized.

Note that these assumptions are made for convenience and discussion purposes and should not be viewed as limitations on the exemplary embodiments of the invention.

The Gaussian half-duplex relay channel model is defined by the following relationships:

$$Y_1 = h_{SD}X_1 + N_{D_1} \qquad (1)$$

$$V_1 = h_{SR}X_1 + N_{R_1} \qquad (2)$$

$$\hat{V}_1 = \kappa(V_1 + N_q) \qquad (3)$$

$$Y_2 = h_{SD}X_2 + h_{RD}W_2 + N_{D_2} \qquad (4)$$

In the above model, $h_{SR}$ is the source-to-relay channel gain, and $N_{R_1}$ is the noise realization at the relay receiver in BC mode. The SR channel gain is denoted $\gamma_{SR} = |h_{SR}|^2$. The remaining expressions can be similarly interpreted. All noises are zero-mean unit-variance Gaussians with the exception of the quantization error $N_q$, which is zero mean with variance $\sigma_q^2$. The parameter $\kappa$ depends on the quantization error and the source variance (see R. G. Gallager, Information Theory and Reliable Communication, John Wiley and Sons, 1968, FIG. 9.7.3); however, it may be safely ignored since it does not affect rate calculations.

An average global transmission power constraint is imposed on the nodes, given by $$tP_{S_1}+(1-t)(P_{S_2}+P_{R_2}) \leq P \quad (5)$$

where $P_{S_1}=E[X_1^2]$, for example, denotes the source transmission power in BC mode, and P represents the total system transmission power. Since noise power is normalized to unity, P is also the equivalent relay channel SNR in the plots.

Compare half-duplex relaying with both direct and two-hop communication. In the two-hop channel, $h_{SD}=0$, meaning that the destination ignores the source transmission. For fair comparison, the sum power P is identical in all cases. In the two-hop case, $P_{S_2}=0$, whereas t=1 gives the power constraint for the direct link.

The relay position is described as follows. The distance between S and D is normalized to unity. For convenience, the relay R is assumed to lie on the straight line joining S and D. The relay position, denoted d, represents its distance from the source. The collinearity of S, R and D is not used in deriving any of the results, but rather enables a simple one-dimensional characterization of the relay position. The SD channel gain is given by $\gamma_{SD}=1$, the SR gain is $$\gamma_{SR} = \frac{1}{|d|^\lambda},$$

and the RD gain is $$\gamma_{RD} = \frac{1}{|1-d|^\lambda},$$

where λ is the channel attenuation exponent. λ=3 will be used, unless mentioned otherwise. Note that the above assumptions are made for convenience and discussion purposes and should not be viewed as limitations on the exemplary embodiments of the invention. Similarly, λ may take other values.

3—Achievable Rate and Information Theoretic Coding for EF Relaying

In this section, the achievable rate of EF relaying is discussed, and the information theoretic coding scheme that achieves this rate is outlined. The goal is to draw inspiration from the information theoretic coding scheme to build a low-complexity practical scheme that will realize a significant portion of the achievable rate.

3.1—Achievable Rate of EF Relaying

Theorem 3.1: The following rate is achieved by EF relaying on a general half-duplex relay channel $$R_{EF} = \sup_{0 \leq t \leq 1} tI(X_1; Y_1, \hat{V}_1) + t'R_{SD_2} \quad (6)$$

subject to the constraint $$tI(V_1; Y_1, \hat{V}_1) \leq t'R_{RD_2} \quad (7)$$

where $R_{SD_2}$ and $R_{RD_2}$ satisfy $$R_{SD_2} \leq I(X_2; Y_2|W_2), R_{RD_2} \leq I(W_2; Y_2|X_2), R_{SD_2}+R_{RD_2} \leq I(X_2, W_2; Y_2) \quad (8)$$

Corollary 3.2: The following rate is achievable by EF relaying on a half-duplex Gaussian relay channel $$R_{EF_G} = \sup_{0 \leq t \leq 1} tC\left(\gamma_{SD}P_{S_1} + \frac{\gamma_{SR}P_{S_1}}{1+\sigma_q^2}\right) + t'R_{SD_2} \quad (9)$$

subject to the constraint $$tC\left(\frac{1}{\sigma_q^2}\left(1+\frac{\gamma_{SR}P_{S_1}}{1+\gamma_{SD}P_{S_1}}\right)\right) \leq t'R_{RD_2} \quad (10)$$

where $R_{SD_2}$ and $R_{RD_2}$ satisfy $$R_{SD_2} \leq C(\gamma_{SD}P_{S_2}), R_{RD_2} \leq C(\gamma_{RD}P_{R_2}), R_{SD_2}+R_{RD_2} \leq C(\gamma_{SD}P_{S_2}+\gamma_{RD}P_{R_2}) \quad (11)$$

3.2—Observations Concerning the Achievable Rate

The following observations are useful either from the standpoint of achievability of the above rates or the implementability of the EF protocol. It should be noted that these observations are for time-invariant Gaussian channels. Some of these intuitions are not universally applicable and, for example, do not hold in a Rayleigh fading channel with CSI available only at the receivers.

1. The achievable rate of a relay channel with Gaussian links, as a multiple of the direct link capacity, approaches 1 at high SNRs. This is easily shown, for example, by comparing the upper bound on relay capacity due to a 1×2 channel with the capacity of a direct link. Therefore, relaying is primarily useful at low and medium SNR values.

2. In order to achieve the rate of Corollary 3.2, one needs Wyner-Ziv coding, where the received signal at the relay is quantized taking into account side information $Y_1$ at the destination. In practice, however, an implementation of Wyner-Ziv coding may involve significant system complexity. The following rate is achievable if Wyner-Ziv coding is not used.

Corollary 3.3: The achievable rate when the received signal at the relay is quantized without exploiting side information $Y_1$ at the destination is given by equations (9,11) and the following constraint $$tI(V_1; \hat{V}_1) \leq t'R_{RD_2} \quad (12)$$

$$\Rightarrow tC\left(\frac{\gamma_{SR}P_{S_1}+1}{\sigma_q^2}\right) \leq t'R_{RD_2} \quad (13)$$

replacing (10) in Theorem 3.2 above.

Constraints (10) and (13) become identical when $\gamma_{SD}P_{S_1} \to 0$, i.e., in the low SNR regime, or when the SD link is very weak.

3. With a sum-power constraint, the sum capacity of a general MA is maximized when all of the MA mode power is given to the transmitting node with the better channel. Since EF relaying is most useful when the RD link is strong, allocate most or all of the MA mode power to the relay. Such a power allocation also has an important practical advantage, namely that the MA becomes a single-user channel, eliminating the need for multi-user decoding. In this situation, the rate $R_{SD_2}$ is reduced to zero.

3.3—Information Theoretic Coding for EF Relaying

The following is a brief outline of the information theoretic coding scheme that achieves the rates in Section 3.1 above.

The information to be sent is separated into two components ($\omega$, $\nu$). In BC mode, the source encodes information $\omega$ to generate a codeword $X_1$ for transmission, which is corrupted and received as $Y_1$ by the destination and as $V_1$ by the relay. Neither the destination nor the relay attempts to decode this information. The destination stores its received signal, whereas the relay generates an estimate (a compressed or quantized signal) $\hat{V}_1$ from $V_1$. In the second (MA) mode, the relay encodes its compressed signal, $\hat{V}_1$, to yield a codeword W for transmission over the RD link. The compression of $V_1$ is at a rate $R_2$ such that the RD link can reliably carry $\hat{V}_1$. In the second phase, the source may transmit new information $\nu$ at a rate $R_1$ permitted by the multiple-access channel.

In BC mode, one may consider S to be a single transmitter and R and D to be a pair of receivers that communicate over the RD link. This resembles a 1×2 SIMO system. If lossless communication over the RD link were possible, then the capacity of this 1×2 channel would be $I(X_1; Y_1, V_1)$, where I is an information function. However, since the RD link can communicate only $\hat{V}_1$ reliably (by condition (7)), the rate that can be achieves is limited to $I(X_1; Y_1, \hat{V}_1)$ in BC mode. In MA mode, S and R act as sources, and D as the destination. R sends $\hat{V}_1$ to D over the RD link at a rate $R_2$. The remaining capacity of the MA is utilized by S to send new information $\nu$ to the destination at a rate $R_1$. The rates $R_1$ and $R_2$ belong to the capacity region of the multiple-access channel.

One challenge in EF relaying is that of obtaining the estimate $\hat{V}_1$ from $V_1$.

4—Practical EF Relaying

First, consider simplifications that reduce implementation complexity with little or no loss of performance. Based on observation 1 in Section 3.2, focus on the low SNR regime where several facts make system design considerably simpler. First, Wyner-Ziv coding can be avoided, since it yields negligible gain over maximal-ratio combining at low SNRs, and is also complex in its implementation. Therefore, consider quantization schemes that do not exploit side information at the destination to compress the relay's estimate.

Even if side information is ignored for coding at the relay, achieving the information theoretic limit of quantization may involve using vector quantization (VQ), which in itself is computationally difficult. The second simplification is motivated by the following result. See D. Marco and D. L. Neuhoff, "Low resolution scalar quantization for Gaussian sources and squared error," IEEE Trans. Inform. Theory, vol. 52, pp. 1689-1697, April 2006. As the quantization rate approaches zero, scalar quantization (SQ) with entropy coding approaches the rate-distortion performance of VQ. In other words, if the rate-distortion characteristics of both scalar and vector quantization were plotted, then both would cut the x-axis at the same point, and not only that, the tangents to both curves at that point would have the same slope. Therefore, as long as the quantization rate is small, the use of scalar quantization does not incur significant loss.

Exclusive consideration of the low SNR regime allows one to concentrate on the problem of quantizer-design for EF relaying. The results are illustrated below with binary modulation per channel dimension, which is known to be efficient at low SNRs. However, the exemplary embodiments of the invention are not limited to this one modulation scheme and may be utilized with other modulation schemes, such as any finite higher-order modulation scheme, as a non-limiting example.

In further exemplary embodiments, quantizers designed in accordance with the exemplary embodiments of the invention can be used in conjunction with practical Slepian-Wolf coders to simulate Wyner-Ziv coding, which can achieve a large percentage of the EF relay achievable rate at medium or high SNRs. The corresponding Slepian-Wolf coder should preferably be flexible enough to efficiently compress the quantized information at the relay, keeping in mind that the quantizer output will generally not be binary. Moreover, the Slepian-Wolf code should also preferably reduce to an efficient single-user code in the case of no side information, which corresponds to the low SNR regime.

4.1—Quantizer Design for EF Relaying

Given a received signal at the relay, the all-important question is: how should the estimate be formed? Information theory suggests that Wyner-Ziv coding, which is a distortion-minimizing technique, should be used to quantize and compress the signal at the relay. Guided by the above principle, it would seem that a distortion-minimizing strategy is the best strategy at the relay even when the source transmits a small finite constellation instead of a Gaussian codebook. Below, it is demonstrated that such a generalization is incorrect, and can lead to substantial loss of performance. The goal of the quantization problem should actually be one of maximizing the amount of useful information in the quantizer output regarding the source transmission.

Consider specifics of the quantizer-design problem. Let N be the total number of symbols transmitted in BC and MA modes, of which tN are BPSK symbols sent in BC mode. Let $n_b$ be the number of bits ($n_b$ may be fractional) available at the relay to quantize each of the received BC mode symbols. It follows that $$n_b = \frac{t'}{t} R_{RD_2} \qquad (14)$$

Figure 3:
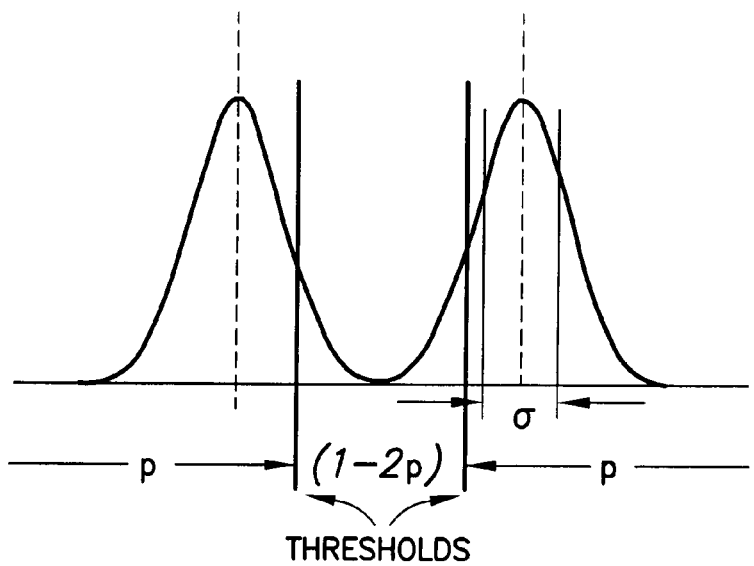
FIG. 3 shows an exemplary quantization of a relay signal with three quantization intervals defined by two thresholds that are symmetric relative to the origin.

The probability density function of the received symbol $V_1$ at the relay is $p_{V_1}(v_1)$. For binary modulation over the SR link, $p_{V_1}(v_1)$ is a sum of two Gaussians with different means but the same variance, as shown in FIG. 3. Without loss of accuracy, one may assume that the two aforementioned Gaussians have means ±1 and variance $\sigma^2$, where $1/\sigma^2$ is the received SNR at the relay. Therefore, the received signal at the relay has a probability distribution $$p_{V_1}(v_1) = \frac{1}{2}\left(\frac{1}{\sqrt{2\pi\sigma^2}}e^{-\frac{(v_1-1)^2}{2\sigma^2}} + \frac{1}{\sqrt{2\pi\sigma^2}}e^{-\frac{(v_1+1)^2}{2\sigma^2}}\right) \qquad (15)$$

The following are attributes of the quantizer used to compress the received signal with the above density.

1. The quantizer uses S−1 thresholds to partition $p_{V_1}$ into S sets with probabilities $p_{v1}, p_{v2}, \ldots, p_{vS}$.

2. The entropy of the quantizer is constrained by the rate of the relay-destination link, i.e., $H(p_{v1}, p_{v2}, \ldots, p_{vS}) \leq n_b$, where H is an information entropy function or Shannon entropy.

3. Since the distribution of the received signal at the relay is symmetric about the origin, one may assume that the quantizer thresholds will be symmetric with respect to the origin.

FIG. 3 shows an example of quantizing the relay signal with three quantization intervals defined by two thresholds that are symmetric relative to the origin. In this example, $n_b \leq \log_2 3$. Furthermore, $n_b = H(p, 1-2p, p)$.

4.2—Suboptimality of Distortion-Minimization

An Example

Figure 4:
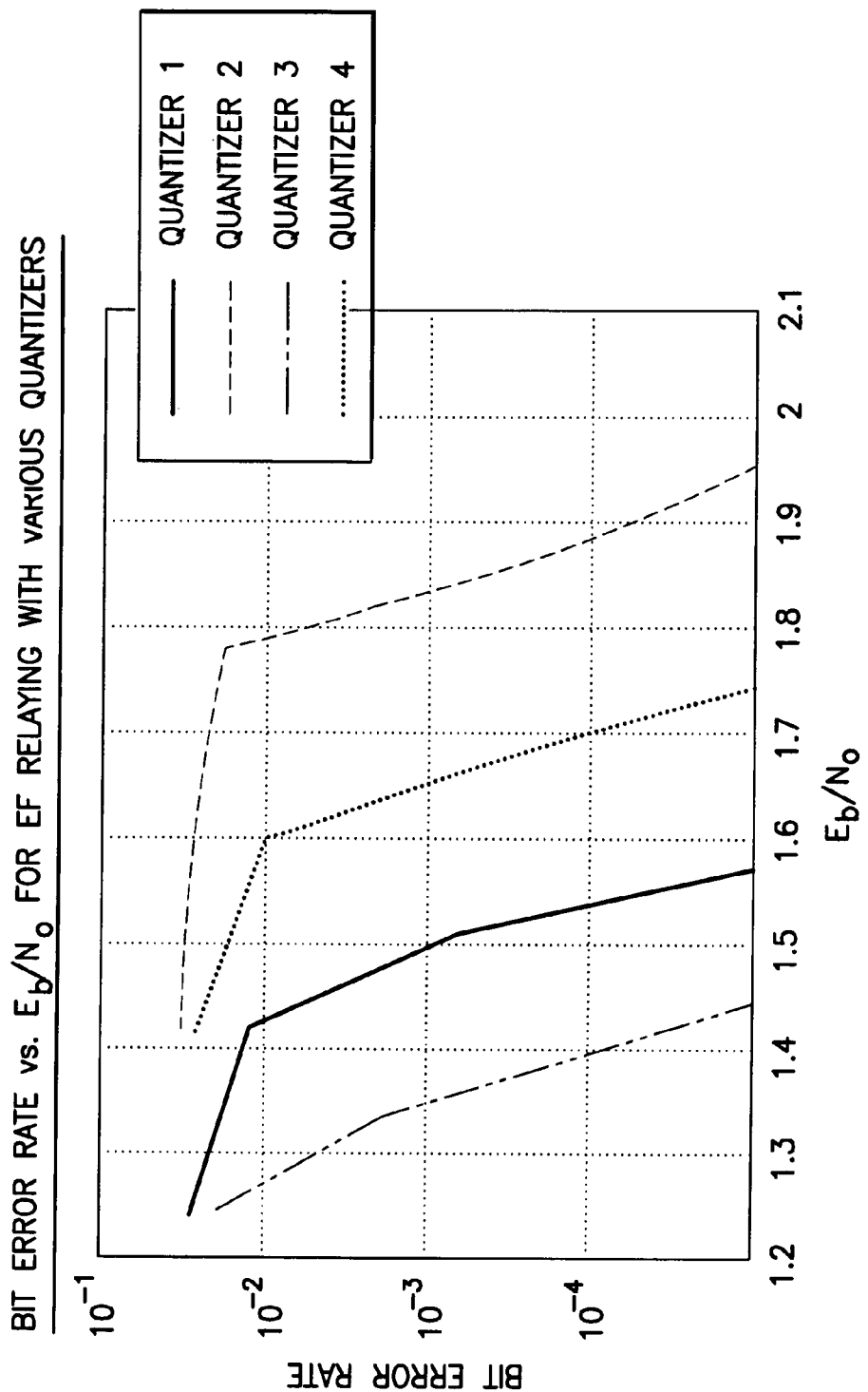
FIG. 4 shows the bit error rate (BER) performance of the estimate-and-forward (EF) protocol with four exemplary quantizers.
Figure 5:
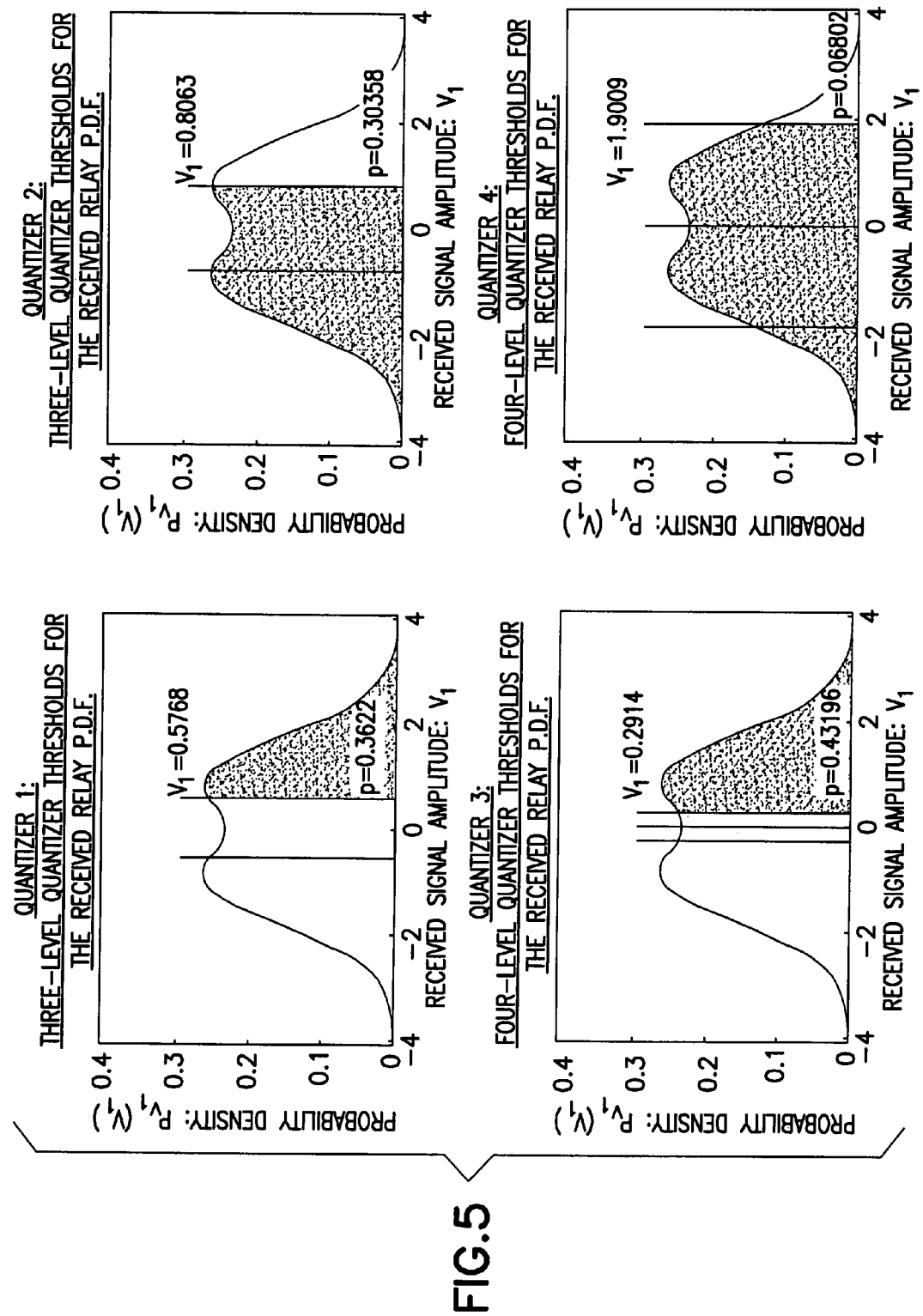
FIG. 5 depicts the quantizer thresholds and partition probabilities for each of the four exemplary quantizers of FIG. 4.

One challenge in quantizer design is choosing thresholds. In a conventional rate-distortion problem, the goal would be to discover the quantizer that minimizes distortion subject to the rate constraint. To motivate the instant results (in accordance with the exemplary embodiments of the invention), consider an example that illustrates the suboptimality of the above conventional approach. For a total power of P=0 dB, below, the performance of four quantizers satisfying the three attributes enumerated in Section 4.1 are compared. In particular, the rate constraint is met with equality by all four quantizers. Of the four, two are three level quantizers, and the remaining two are four-level quantizers. FIG. 5 depicts the quantizer thresholds and the partition probabilities. These quantizers are referred to as Quantizer 1 through Quantizer 4, as indicated in FIG. 5. Among the four quantizers, Quantizer 3 has the largest mean-squared distortion, which is evident even from visual inspection, followed by Quantizers 1, 2, and 4, in that order. FIG. 4 shows the bit-error-rate (BER) performance of the EF protocol with the above quantizers at 0 db SNR, from which one can see that Quantizer 3 performs best, followed by quantizers 1, 4, and 2. The surprising observation is that the quantizer with the largest distortion also has the best error performance. The quantizer with the least distortion has the second-best performance.

The example above clearly illustrates that distortion-minimization should not be the objective of quantizers used in EF relaying. Instead, the relay should attempt to send a low rate signal to the destination that retains as much information about the source transmission as possible. Faithful reconstruction of the relay signal, for which distortion-minimization is the best approach, should not be a criterion.

4.3—Mutual Information Maximization

A Criterion for Quantizer Design

Since the destination is interested only in the information contained in the source transmission, it is desirable to maximize the mutual information between the source transmission and the quantized output. This section describes an exemplary implementation of how to use mutual information maximization as a criterion for quantizer design.

Figure 6:
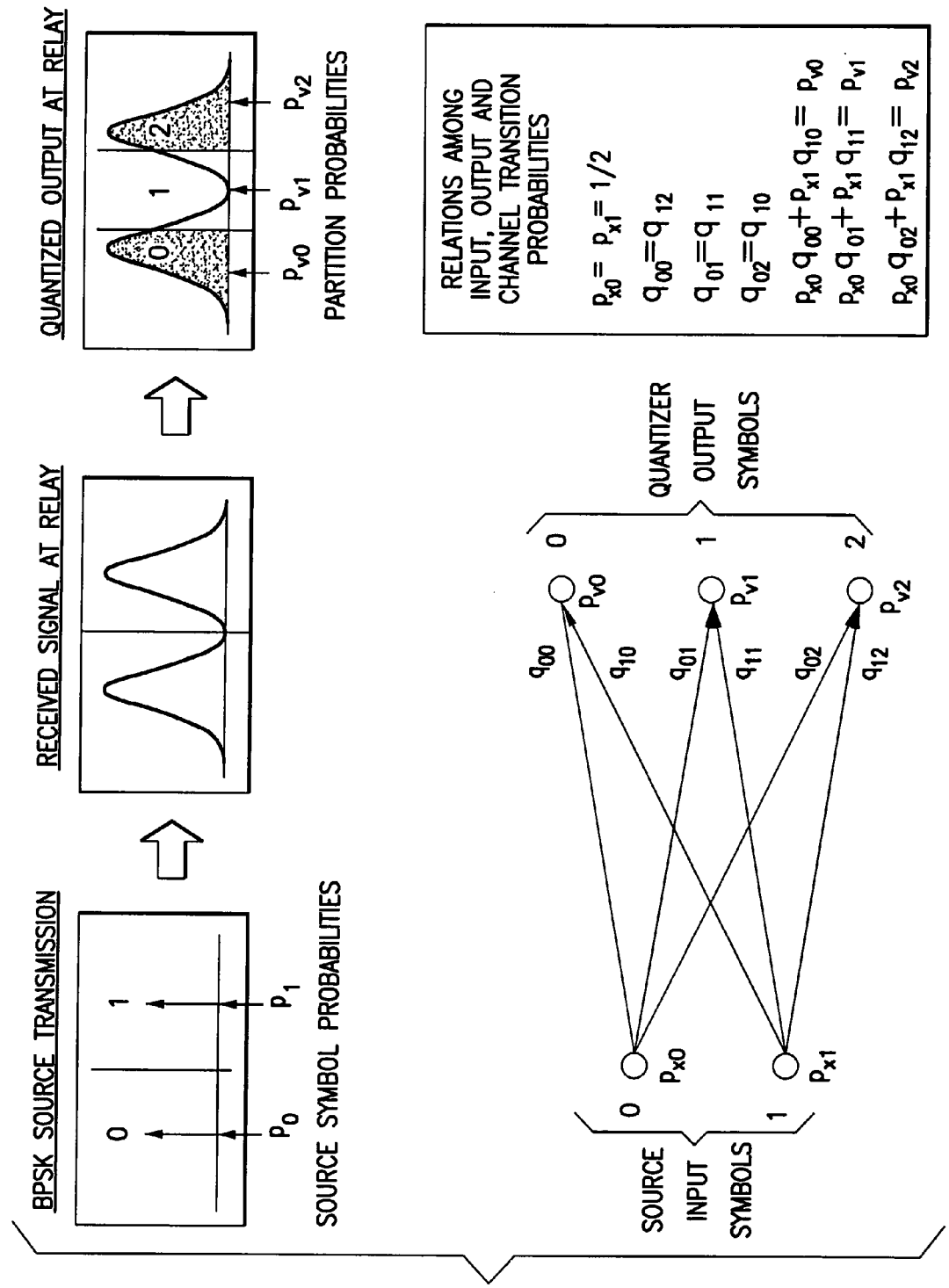
FIG. 6 illustrates an exemplary channel model for a single equivalent channel and an exemplary relay quantizer having three levels.

The quantizers still satisfy the three basic conditions laid out in Section 4.1. All elements in between the source transmission and the quantizer output—channel attenuation, receiver noise at the relay, and quantization at the relay—can be modeled as a single equivalent channel, as illustrated in FIG. 6. The figure depicts a scenario where the source uses binary modulation and the relay quantizer has three levels. The resulting equivalent channel is a discrete two-input three-output memory-less channel. The input to the channel is $X_1$ which takes values 0, 1 with probabilities $p_{x0}$ and $p_{x1}$ respectively, and the output is $\hat{V}_1$ which takes values 0, 1 and 2 with probabilities $p_{v0}$, $p_{v1}$ and $p_{v2}$, respectively. The channel transition probability $p(\hat{V}_1=j|X_1=i)$ is denoted $q_{ij}$. When the source transmits a symbol i, the analog received signal at the relay lies in quantizer interval j with probability $q_{ij}$. One may assume that the source symbol probability distribution is uniform, meaning $p_{x0}=p_{x1}=\frac{1}{2}$. An equi-probable source alphabet is commonly assumed in practical systems, and incurs little or no loss of rate for small modulation sizes. As mentioned before, the quantizer thresholds are symmetrically placed, so that source symbols on both sides of the origin are similarly treated by the quantizer. The symmetry of thresholds leads to symmetric transition probabilities $q_{ij}=q_{(1-i)(2-j)}$. It will be convenient to use the following vector/matrix representations of the probabilities:

$$P_x = [\, p_{x0} \quad p_{x1} \,] \tag{16}$$

$$P_v = [\, p_{v0} \quad p_{v1} \quad p_{v2} \,] \tag{17}$$

$$Q = \begin{bmatrix} q_{00} & q_{01} & q_{02} \\ q_{10} & q_{11} & q_{12} \end{bmatrix} \tag{18}$$

with the following equation relating input, output, and transition probabilities $$P_x Q = P_v \tag{19}$$

An objective function to be maximized is the mutual information between the source symbol $X_1$ and the relay output $\hat{V}_1$, given by the familiar expression $$I(X_1; \hat{V}_1) = H(\hat{V}_1) - H(\hat{V}_1 | X_1) \tag{20}$$

All entropies on the right hand side of equation (20) are functions of Q alone, since $P_x$ is fixed to the uniform distribution. The goal, therefore, is to find the matrix Q that maximizes the above objective. The following observations offer insights on the optimization problem, and considerably simplify the search for a solution.

Since $\hat{V}_1$, the quantizer output, is a deterministic function of the quantizer input $V_1$ alone, one has $I(V_1; \hat{V}_1) = H(\hat{V}_1)$. Therefore, (12) yields the following constraint for the optimization problem above.

$$H(\hat{V}_1) \leq \frac{t'}{t} R_{RD_2} \tag{21}$$

Not all Q are feasible. In the simple two-input three-output channel that is considered, for example, the probability $q_{00}$ determines the positions of both thresholds (since they are symmetric), and in effect determines the entire matrix Q. One may say that Q is parameterized by $q_{00}$. The set of feasible Q is not convex; however, it is path-connected. In the example, it is easy to see that small changes in $q_{00}$ result in small changes in the remaining entries of Q.

$I(X_1; \hat{V}_1)$ is a convex function of Q, whereas $H(\hat{V}_1)$ is a concave function. See T. Cover and J. Thomas, Elements of Information Theory, John Wiley and Sons, 1991, Theorem 2.7.4. Therefore, constraint (21) eliminates a convex set from the set of all Q.

As a consequence of the above, one only need consider points within the feasible set of Q (those corresponding to actual thresholds), which either satisfy (21) with equality, or which otherwise correspond to local maxima on the feasible set. A simple search among the reduced set of possibilities yields the maximum.

The above procedure is repeated for each equivalent channel, or for each choice of the number of quantizer output bins, since the input is fixed to the modulation. Note that a symmetric quantizer with S+2 bins can equal or outperform a quantizer with S bins because the latter is a special case of the former where two bins have zero probability. Does this mean that one should choose quantizers with as many bins as possible? Empirically, it has been observed that having many more bins than the minimum necessary hardly increases mutual information. For example, if $n_b$, the number of bits available to quantize each received symbol lies in between $\log_2(3)$ and $\log_2(4)$, then one would need at least 4 quantization bins. In this case, the designer may consider quantizers with 5 or 6 bins, but having more than 6 bins will not increase the achieved mutual information noticeably.

In the example shown in FIGS. 6, 3 and 4 output quantizers were considered. The optimum value of $q_{00}=0.43196$ was obtained on a four-level quantizer with thresholds at $0, \pm 0.2914$, or Quantizer 3 in FIG. 5. The rate constraint (21) is satisfied with equality at the optimum.

One may note that Quantizers 1 through 4 in FIG. 5 yield mutual informations 0.557, 0.512, 0.563 and 0.520 respectively, which correctly explains the trend in the BERs of the four quantizers, as shown in FIG. 4.

Having found the quantizer thresholds, the next task is to find representatives for each quantization interval. For example, the destination may treat these representatives as outputs of an AWGN channel, and combine them with the soft values received directly over the source-destination link in the LLR domain. Therefore, representatives may be chosen within each interval which correspond to LLRs that agree with the channel transition probabilities. For example, given the information that the received signal at the relay was in quantization interval j, its LLR would be $$\log\left(\frac{q_{0j}}{q_{1j}}\right).$$

When the received probability density is $p_{V_1}(v_1)$ as given by (15), the LLR for a received value v is $2v/\sigma^2$. One may find the representative $r_j$ for each interval j by equating $$\frac{2r_j}{\sigma^2} = \log\left(\frac{q_{0,j}}{q_{1,j}}\right) \qquad (22)$$

The final step at the destination is the combining of the relay and destination signals, for example, using maximal-ratio combining. In combining the two signals, the destination may take into account quantization noise and/or channel noise.

The above steps would remain valid for arbitrary source modulation alphabet sizes and any number of quantizer output bins. That is, the above is simply one non-limiting example of how to implement a quantizer in accordance with the exemplary embodiments of the invention. It should be appreciated that other suitable techniques may similarly be utilized.

5—Numerical Results

In this section, end-to-end bit error rates for an exemplary implementation of the EF protocol at low SNRs are presented. The exemplary source channel codes its bits with an LDPC code of suitable rate and blocklength 100K. The degree distributions of these LDPC codes are obtained from "ldpcopt—a fast and accurate degree distribution optimizer for ldpc code ensembles," Internet document. The exemplary relay quantizes its received signal with a quantizer designed using the technique of Section 4.3. The quantizer output is then channel coded and transmitted over the relay-destination link in MA mode. Coding over the RD link is not explicitly simulated. Instead, its capacity is used as its rate. This does not compromise accuracy since the overall achievable rate is found to be insensitive to small changes in the RD link rate at low SNR. See A. Chakrabarti, A. de Baynast, A. Sabharwal, and B. Aazhang, "Half-duplex estimate-and-forward relaying: Bounds and code design," in Proc. of ISIT, July 2006, pp. 1239-1243.

Figure 7:
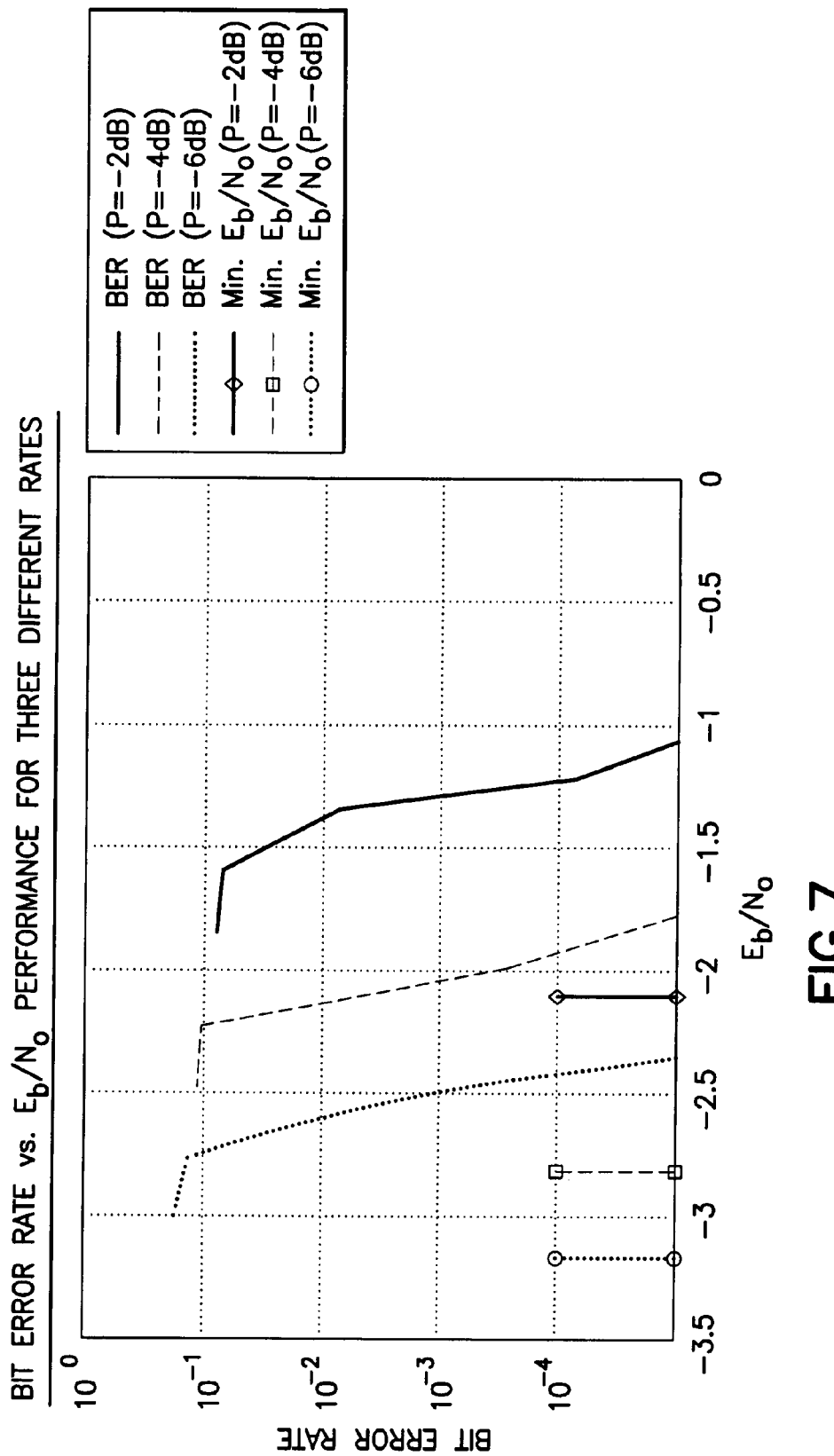
FIG. 7 shows a plot of the end-to-end BER against the overall $E_b/N_0$.

Performance is simulated for the three SNRs $-2, -4,$ and $-6$ dB. The LDPC codes used in BC mode for the above SNRs have rates 0.70, 0.55, and 0.40 respectively. The end-to-end BER is plotted against the overall $E_b/N_0$ in FIG. 7. At a BER of $10^{-4}$, the three codes in the order of decreasing rates are respectively 0.9, 0.9, and 0.8 dB away from their theoretical minimum $E_b/N_0$.

Figure 8:
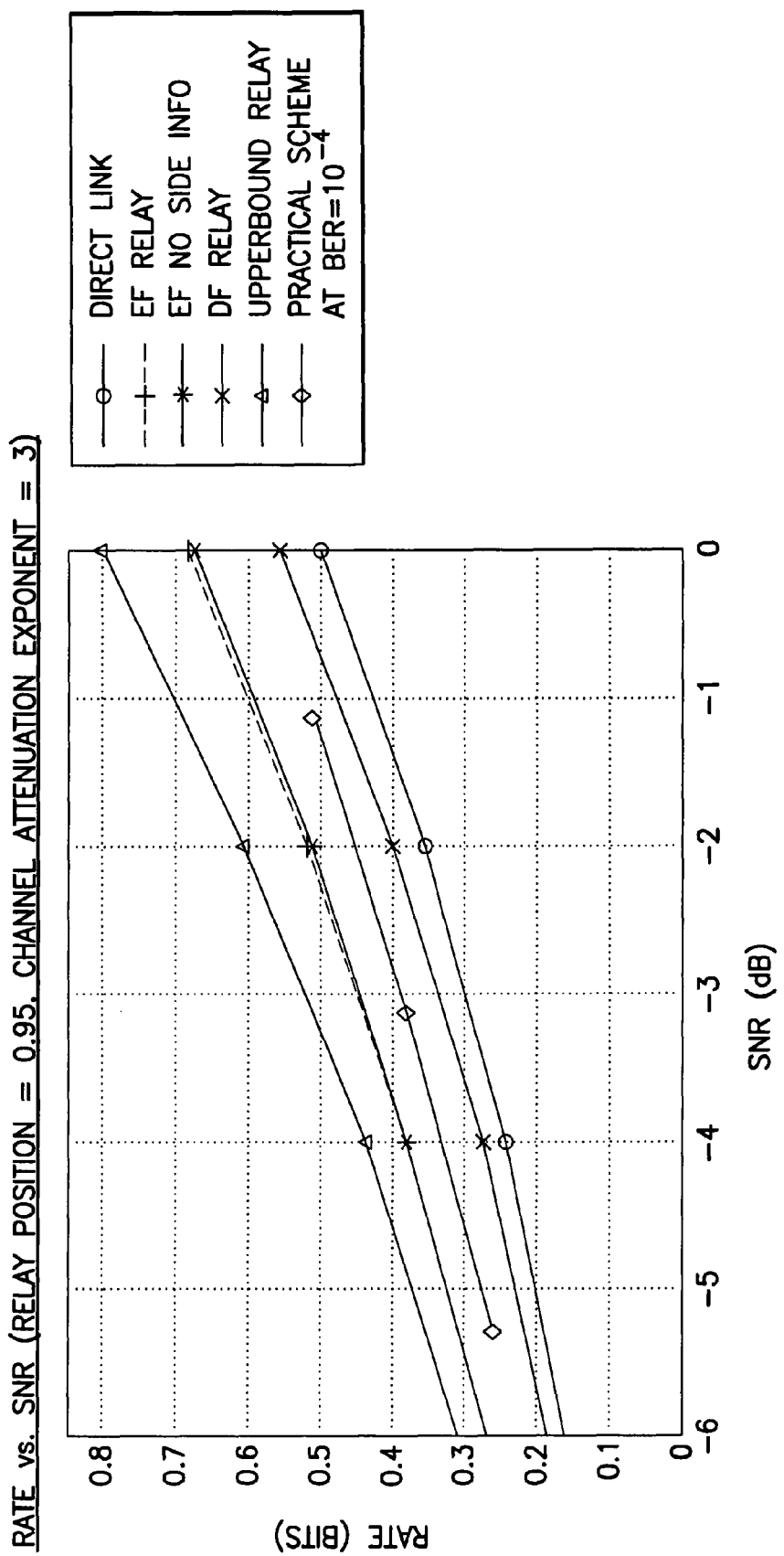
FIG. 8 depicts a plot of the achievable rate of the EF protocol vs. the signal to noise ratio (SNR) at which the BER is lower than $10^{-4}$.

Based on the performance of the above codes, in FIG. 8 the achievable rate of the EF protocol is plotted vs. the SNR at which the BER is lower than $10^{-4}$. The exemplary implementation outperforms the capacities of the direct link as well as that of DF relaying. Note that here, practical codes for the relay channel are compared with theoretical limits for the other two channels. The margin of gain would be larger, for example, if one compared relay codes with actual codes for direct and DF communication.

6—Conclusion

An exemplary quantizer design technique for EF relaying has been presented based on mutual information maximization between the source transmission and the quantizer output(s). The exemplary technique outperforms the standard method of distortion minimization.

Figure 9:
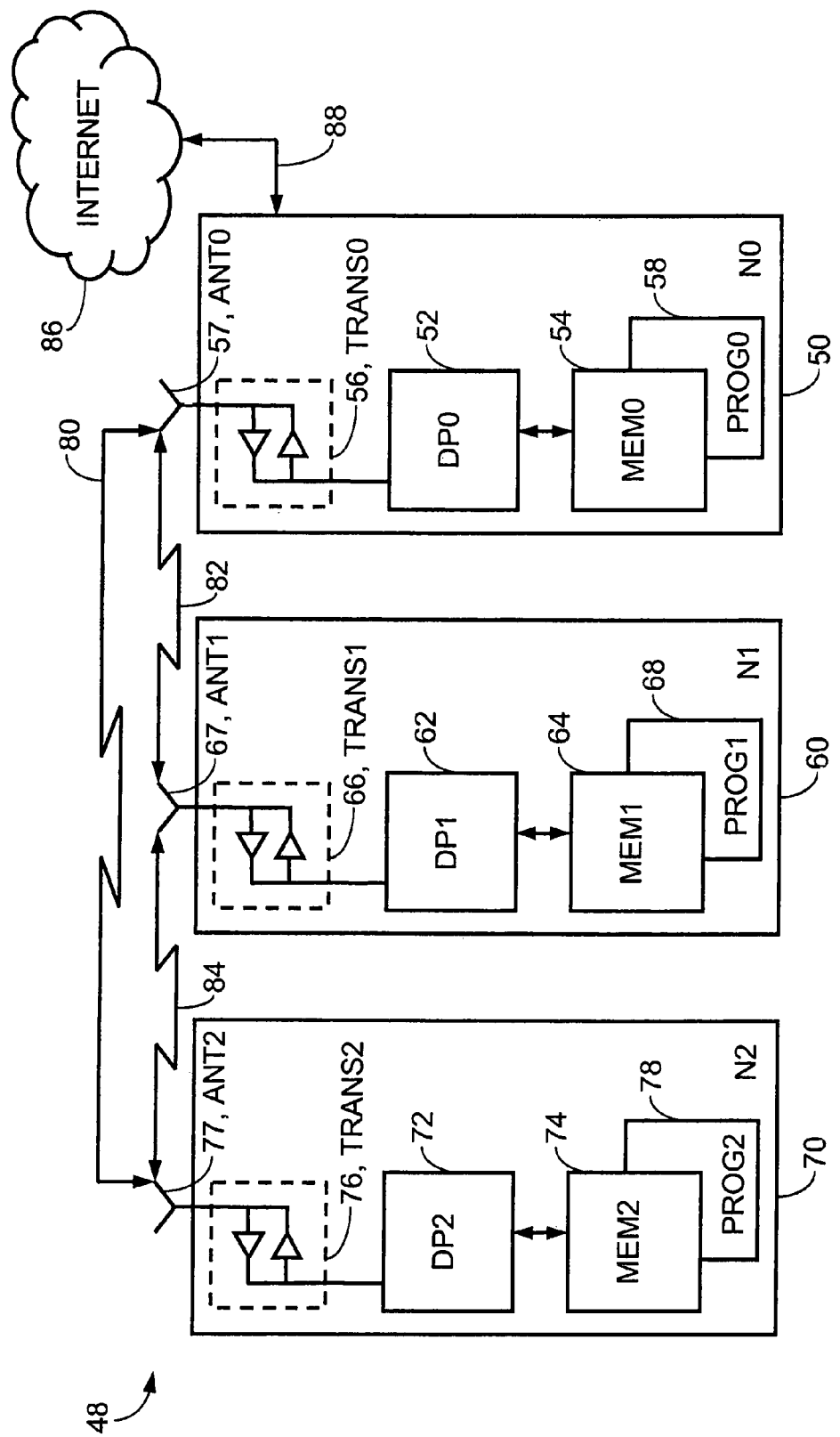
FIG. 9 illustrates a simplified block diagram of various electronic devices that are suitable for use in practicing the exemplary embodiments of this invention.

Reference is made to FIG. 9 for illustrating a simplified block diagram of various electronic devices that are suitable for use in practicing the exemplary embodiments of this invention. In FIG. 9, a wireless communication system 48 includes a Node0 (N0) 50, a Node1 (N1) 60 and a Node2 (N2) 70. As non-limiting examples, the wireless communication system 48 may comprise a network, a cellular network (e.g., a TDMA system, a FDMA system, a CDMA system, a CDMA2000 system, a WCDMA system, an OFDMA system, a 3G system, an E-UTRAN), a WAN, a WLAN, a Bluetooth® system or a WiMAX system.

The N0 50 includes: a data processor (DP0) 52; a memory (MEM0) 54 coupled to the DP0 52; a suitable RF transceiver (TRANS0) 56 (having a transmitter (TX) and a receiver (RX)) coupled to the DP0 52; and a suitable antenna (ANT0) 57 coupled to the TRANS0 56. The MEM0 54 stores a program (PROG0) 58. The TRANS0 56 is capable of wireless communication with both the N2 70 (via a direct link 80) and the N1 60 (via an indirect link 82). The N0 50 may comprise a Node B, a BS, an access node, an access gateway or a UE, as non-limiting examples. The N0 50 generally corresponds to the destination node or information destination, as discussed elsewhere herein.

In some exemplary embodiments, the N0 50 may be coupled to other electronic devices, such as one or more Node Bs, BSs, access gateways, access nodes or networks. As a non-limiting example, the N0 50 may be coupled to the internet 86 via a communication link 88. In other exemplary embodiments, one or both of the N1 60 and the N2 70 can access the internet 86 by communicating with the N0 50.

The N1 60 includes: a data processor (DP1) 62; a memory (MEM1) 64 coupled to the DP1 62; a suitable RF transceiver (TRANS1) 66 (having a transmitter (TX) and a receiver (RX)) coupled to the DP1 62; and a suitable antenna (ANT1) 67 coupled to the TRANS1 66. The MEM1 64 stores a program (PROG1) 68. The TRANS1 66 is capable of wireless communication with both the N0 50 (via the indirect link 82) and the N2 70 (via another link 84). The N1 60 may comprise a Node B, a BS, an access node, an access gateway or a UE, as non-limiting examples. The N1 60 generally corresponds to the relay or relay node, as discussed elsewhere herein.

The N2 70 includes: a data processor (DP2) 72; a memory (MEM2) 74 coupled to the DP2 72; a suitable RF transceiver (TRANS2) 76 (having a transmitter (TX) and a receiver (RX)) coupled to the DP2 72; and a suitable antenna (ANT2) 77 coupled to the TRANS2 76. The MEM2 74 stores a program (PROG2) 78. The TRANS2 76 is capable of wireless communication with both the N0 50 (via a direct link 80) and the N1 60 (via the other link 84). The N2 70 may comprise a Node B, a BS, an access node, an access gateway or a UE, as non-limiting examples. The N2 70 generally corresponds to the information source or source node, as discussed elsewhere herein.

At least one of the PROGs 58, 68, 78 is assumed to include program instructions that, when executed by the associated DP, enable the electronic device(s) to operate in accordance with the exemplary embodiments of this invention, as discussed herein.

In general, the various embodiments of the nodes 50, 60, 70 can include, but are not limited to, cellular phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The exemplary embodiments of this invention may be implemented by computer software executable by one or more of the DPs 52, 62, 72 of the nodes 50, 60, 70, or by hardware, or by a combination of software and hardware. As a non-limiting example, the exemplary embodiments of the invention may be implemented by circuitry and/or one or more integrated circuits.

The MEMs 54, 64, 74 may be of any type suitable to the local technical environment and may be implemented using any suitable data storage technology, such as semiconductor-based memory devices, magnetic memory devices and systems, optical memory devices and systems, fixed memory and removable memory, as non-limiting examples. The DPs 52, 62, 72 may be of any type suitable to the local technical environment, and may include one or more of general purpose computers, special purpose computers, microprocessors, digital signal processors (DSPs) and processors based on a multi-core processor architecture, as non-limiting examples.

The configuration of the system and devices shown in FIG. 9 is provided only as one non-limiting example. One of ordinary skill in the art will appreciate other configurations that may be utilized in conjunction with aspects of the exemplary embodiments of the invention. As non-limiting examples of such other configurations, one or more of the nodes 50, 60, 70 may comprise any suitable number of data processors, memories, transceivers and/or antennas. Furthermore, the wireless communication system 48 may comprise additional nodes, such as additional UEs, BSs, access nodes or relay nodes, as non-limiting examples. Although shown in FIG. 9 as bi-directional, one or more of the links 80, 82, 84 may comprise a unidirectional link. As a non-limiting example, the other link 84 may comprise a unidirectional link such that the N1 60 does not receive communications from the N2 70.

As a non-limiting example, multiple relay stations may use any suitable method of cooperative diversity transmission. In one exemplary embodiment, SFN-type transmission is assumed. This means that the UEs that are transmitting the same data transmit using the same resources, the same transport format (e.g., the same coding (including scrambling, spreading, etc.), modulation, interleaving) and the same pilot transmissions. In such an embodiment, there may not be a need for frequency synchronization, for example.

The exemplary embodiments of the invention may be utilized in any suitable communication system having a relay node. As non-limiting examples, suitable communication systems may include: a cellular network (e.g., a TDMA system, a FDMA system, a CDMA system, a CDMA2000 system, a WCDMA system, an OFDMA system, a 3G system, an E-UTRAN), a WAN, a WLAN, a Bluetooth® system or a WiMAX system.

In one non-limiting, exemplary embodiment, a relay node 60 in accordance with the above-described exemplary techniques receives source data from a source node 70. The relay node 60 determines an estimate of the source data using a quantization technique based on maximizing data throughput. The determined estimate comprises a few bits that are representative of the source data. The relay node 60 transmits the estimate to a destination node 50. The destination node 50 combines the estimate and the source data (as sent from the source node 70 to the destination node 50) to achieve a higher quality signal (e.g., a signal having fewer errors or a better BER). In such a manner, the estimate effectively acts as side information to improve the destination node decoding. As compared with a conventional relay system that utilizes distortion minimization as the metric of interest, this exemplary embodiment utilizes data throughput maximization as the metric of interest.

Note that as utilized herein, data throughput is considered to refer to a reliable amount of information (a reliable amount of data) that can be transmitted and/or received within a communication system. In this context, reliable refers to an acceptable amount or relatively low amount of errors.

Thus, the exemplary embodiments of the invention describe methods, computer program products and apparatus that provide improved quantization, as may be useful within the context of a communication system (e.g., a wireless communication system) that has a relay node. By using a quantization technique based on maximizing data throughput and sending the resulting estimate towards the destination node, the efficiency of the system is improved over conventional relay systems, such as relay systems utilizing distortion-minimizing techniques. A relay system utilizing the exemplary embodiments of the invention has a higher efficiency than a conventional relay system. For example, there is a reduced need to resend (e.g., retransmit) packets from the source node to the destination node. Power consumption may be reduced, for example, due to the fewer retransmissions. Throughput may also be increased. Furthermore, the exemplary embodiments of the invention may be implemented with a relatively low complexity.

Figure 10:
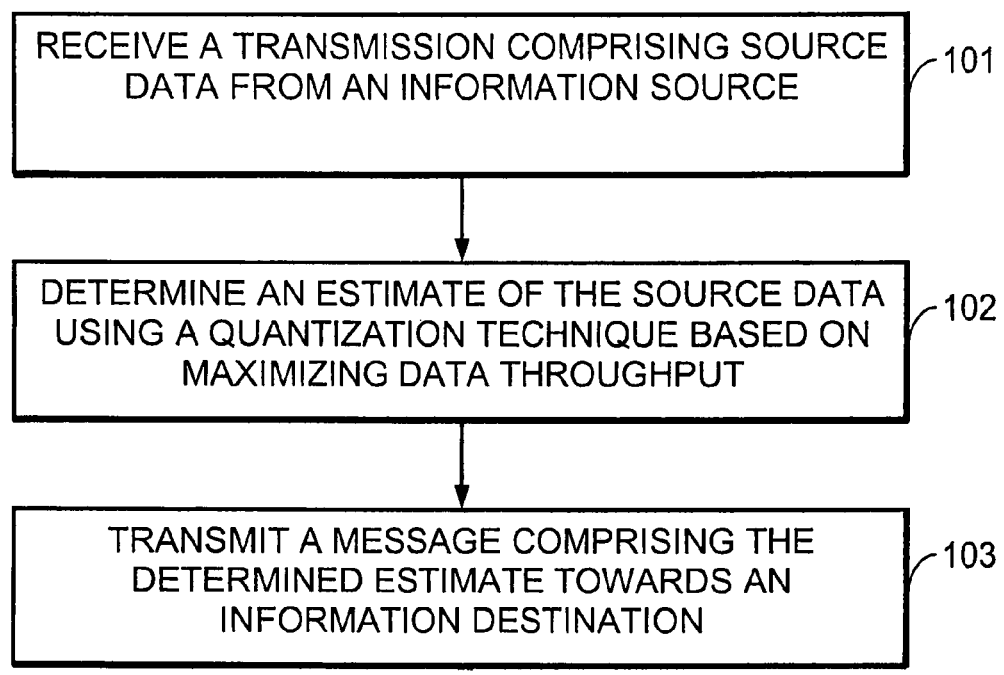
FIG. 10 depicts a flowchart illustrating one non-limiting example of a method for practicing the exemplary embodiments of this invention.

In one non-limiting, exemplary embodiment, and as shown in FIG. 10, a method includes: receiving a transmission comprising source data from an information source (box 101); determining an estimate of the source data using a quantization technique based on maximizing data throughput (box 102); and transmitting a message comprising the determined estimate towards an information destination (box 103).

In other exemplary embodiments, the quantization technique is subject to a data rate constraint. In further exemplary embodiments, the transmission comprising the source data comprises binary modulation per channel dimension. In other exemplary embodiments, the quantization technique further comprises utilizing at least one Slepian-Wolf coder to simulate operation of a Wyner-Ziv coder. In further exemplary embodiments, the quantization technique comprises one of scalar quantization or vector quantization. In other exemplary embodiments, determining the estimate comprises: determining S−1 thresholds, where S≧2; using the S−1 thresholds to partition the received transmission into S quantization intervals; and selecting at least one representative for each quantization interval, where the selected at least one representative for each quantization interval collectively comprises the determined estimate.

In further exemplary embodiments, the method is performed by a relay node. In other exemplary embodiments, the relay node comprises a user equipment. In further exemplary embodiments, the information source, the relay node and the information destination comprise components of a wireless communication system. In other exemplary embodiments, the wireless communication system comprises an evolved universal terrestrial radio access network.

In another non-limiting, exemplary embodiment, a computer program product comprises program instructions embodied on a tangible computer-readable medium, execution of the program instructions resulting in operations comprising: receiving a transmission comprising source data from an information source; determining an estimate of the source data using a quantization technique based on maximizing data throughput; and transmitting a message comprising the determined estimate towards an information destination.

In other exemplary embodiments, the quantization technique is subject to a data rate constraint. In further exemplary embodiments, the transmission comprising the source data comprises binary modulation per channel dimension. In other exemplary embodiments, the quantization technique further comprises utilizing at least one Slepian-Wolf coder to simulate operation of a Wyner-Ziv coder. In further exemplary embodiments, the quantization technique comprises one of scalar quantization or vector quantization. In other exemplary embodiments, determining the estimate comprises: determining S−1 thresholds, where S≧2; using the S−1 thresholds to partition the received transmission into S quantization intervals; and selecting at least one representative for each quantization interval, where the selected at least one representative for each quantization interval collectively comprises the determined estimate.

In further exemplary embodiments, the program instructions are executed by a relay node. In other exemplary embodiments, the relay node comprises a user equipment. In further exemplary embodiments, the information source, the relay node and the information destination comprise components of a wireless communication system. In other exemplary embodiments, the wireless communication system comprises an evolved universal terrestrial radio access network.

In another non-limiting, exemplary embodiment, an electronic device comprises: a receiver configured to receive a transmission comprising source data from a first device; a data processor configured to determine an estimate of the source data using a quantization technique based on maximizing data throughput; and a transmitter configured to transmit a message comprising the determined estimate towards a second device.

In other exemplary embodiments, the electronic device comprises a relay node. In further exemplary embodiments, the electronic device comprises one of a user equipment, a relay device or a base station. In other exemplary embodiments, the electronic device, the first device and the second device comprise components of a wireless communication system. In further exemplary embodiments, the wireless communication system comprises at least one of a time division multiple access system, a frequency division multiple access system, a code division multiple access system and an orthogonal frequency division multiple access system. In other exemplary embodiments, the wireless communication system comprises at least one of a wireless local area network, a Bluetooth® system, a worldwide interoperability for microwave access system and an evolved universal terrestrial radio access network.

In another non-limiting, exemplary embodiment, an electronic device comprises: means for receiving a transmission comprising source data from an information source; means for determining an estimate of the source data using a quantization technique based on maximizing data throughput; and means for transmitting a message comprising the determined estimate towards an information destination.

In other exemplary embodiments, the means for receiving comprises a receiver, the means for determining comprises a data processor and the means for transmitting comprises a transmitter. In further exemplary embodiments, the information source, the electronic device and the information destination comprise components of an evolved universal terrestrial radio access network.

The exemplary embodiments of the invention, as discussed above and as particularly described with respect to exemplary methods, may be implemented as a computer program product comprising program instructions embodied on a tangible computer-readable medium. Execution of the program instructions results in operations comprising steps of utilizing the exemplary embodiments or steps of the method.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The exemplary embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of the non-limiting and exemplary embodiments of this invention.

Furthermore, some of the features of the preferred embodiments of this invention could be used to advantage without the corresponding use of other features. As such, the foregoing description should be considered as merely illustrative of the principles, teachings and exemplary embodiments of this invention, and not in limitation thereof.

What is claimed is:

1. A method comprising:
   receiving, by an apparatus a transmission comprising source data from an information source;
   determining, by the apparatus, an estimate of the source data using a quantization technique based on maximizing data throughput, wherein the quantization technique operates to maximize mutual information between the source data and the determined estimate of the source data; and
   transmitting, by the apparatus, a message comprising the determined estimate towards an information destination, wherein the quantization technique operates to maximize mutual information between the source data and the determined estimate of the source data by maximizing an objective function given by:

$$I(X_1; \hat{V}_1) = H(\hat{V}_1) - H(\hat{V}_1 | X_1),$$

wherein I is an information function, H is an information entropy function or Shannon entropy, $X_1$ is the source data and $\hat{V}_1$ is the determined estimate of the source data, wherein the quantization technique operates within a constraint given by:

$$H(\hat{V}_1) \leq \frac{t'}{t} R,$$

wherein the transmission comprising the source data is received from the information source during a first time slot of duration t and the message comprising the determined estimate is transmitted towards the information destination during a second time slot of duration t', wherein t'=(1−t), wherein R is a data rate for the transmission from the apparatus towards the information destination.

2. The method of claim 1, wherein the quantization technique is subject to a data rate constraint.

3. The method of claim 1, wherein the transmission comprising the source data comprises binary modulation per channel dimension.

4. The method of claim 1, wherein the quantization technique further comprises utilizing at least one Slepian-Wolf coder to simulate operation of a Wyner-Ziv coder.

5. The method of claim 1, wherein the quantization technique comprises one of scalar quantization or vector quantization.

6. The method of claim 1, wherein determining the estimate comprises:
   determining S−1 thresholds, where S≧2;
   using the S−1 thresholds to partition the received transmission into S quantization intervals; and
   selecting at least one representative for each quantization interval, where the selected at least one representative for each quantization interval collectively comprises the determined estimate.

7. The method of claim 1, wherein the method is performed by a relay node.

8. The method of claim 7, wherein the relay node comprises a user equipment.

9. The method of claim 7, wherein the information source, the relay node and the information destination comprise components of a wireless communication system.

10. The method of claim 9, wherein the wireless communication system comprises an evolved universal terrestrial radio access network.

11. A non-transitory computer-readable medium storing program instructions, execution of the program instructions resulting in operations comprising:
    receiving a transmission comprising source data from an information source;
    determining an estimate of the source data using a quantization technique based on maximizing data throughput, wherein the quantization technique operates to maximize mutual information between the source data and the determined estimate of the source data; and
    transmitting a message comprising the determined estimate towards an information destination, wherein the quantization technique operates to maximize mutual information between the source data and the determined estimate of the source data by maximizing an objective function given by:

$$I(X_1; \hat{V}_1) = H(\hat{V}_1) - H(\hat{V}_1 | X_1),$$

wherein I is an information function, H is an information entropy function or Shannon entropy, $X_1$ is the source data and $\hat{V}_1$ is the determined estimate of the source data, wherein the quantization technique operates within a constraint given by:

$$H(\hat{V}_1) \leq \frac{t'}{t} R,$$

wherein the transmission comprising the source data is received from the information source during a first time slot of duration t and the message comprising the determined estimate is transmitted towards the information destination during a second time slot of duration t', wherein t'=(1−t), wherein R is a data rate for the transmission towards the information destination.

12. The computer-readable medium of claim 11, wherein the quantization technique is subject to a data rate constraint.

13. The computer-readable medium of claim 11, wherein determining the estimate comprises:
    determining S−1 thresholds, where S≧2;
    using the S−1 thresholds to partition the received transmission into S quantization intervals; and selecting at least one representative for each quantization interval, where the selected at least one representative for each quantization interval collectively comprises the determined estimate.

14. The computer-readable medium of claim 11, wherein the program instructions are executed by a relay node.

15. The computer-readable medium of claim 14, wherein the relay node comprises a user equipment.

16. The computer-readable medium of claim 14, wherein the information source, the relay node and the information destination comprise components of a wireless communication system.

17. The computer-readable medium of claim 16, wherein the wireless communication system comprises an evolved universal terrestrial radio access network.

18. An apparatus comprising:
a processor; and
a memory including computer program instructions, the memory and the computer program instructions being configured to, with the processor, cause the apparatus at least to perform:
receive a transmission comprising source data from a first device;
determine an estimate of the source data using a quantization technique based on maximizing data throughput, wherein the quantization technique operates to maximize mutual information between the source data and the determined estimate of the source data; and
transmit a message comprising the determined estimate towards a second device, wherein the quantization technique operates to maximize mutual information between the source data and the determined estimate of the source data by maximizing an objective function given by:

$$I(X_1; \hat{V}_1) = H(\hat{V}_1) - H(\hat{V}_1 | X_1),$$

wherein I is an information function, H is an information entropy function or Shannon entropy, $X_1$ is the source data and $\hat{V}_1$ is the determined estimate of the source data, wherein the quantization technique operates within a constraint given by:

$$H(\hat{V}_1) \leq \frac{t'}{t} R,$$

wherein the transmission comprising the source data is received from the information source during a first time slot of duration t and the message comprising the determined estimate is transmitted towards the information destination during a second time slot of duration wherein t'=(1−t), wherein R is a data rate for the transmission from the apparatus towards the information destination.

19. The apparatus of claim 18, wherein the apparatus comprises a relay node.

20. The apparatus of claim 18, wherein the apparatus comprises one of a user equipment, a relay device or a base station.

21. The apparatus of claim 18, wherein the apparatus, the first device and the second device comprise components of a wireless communication system.

22. The apparatus of claim 21, wherein the wireless communication system comprises at least one of a time division multiple access system, a frequency division multiple access system, a code division multiple access system and an orthogonal frequency division multiple access system.

23. The apparatus of claim 21, wherein the wireless communication system comprises at least one of a wireless local area network, a Bluetooth® system, a worldwide interoperability for microwave access system and an evolved universal terrestrial radio access network.

24. An apparatus comprising:
means for receiving a transmission comprising source data from an information source;
means for determining an estimate of the source data using a quantization technique based on maximizing data throughput, wherein the quantization technique operates to maximize mutual information between the source data and the determined estimate of the source data; and
means for transmitting a message comprising the determined estimate towards an information destination, wherein the quantization technique operates to maximize mutual information between the source data and the determined estimate of the source data by maximizing an objective function given by:

$$I(X_1; \hat{V}_1) = H(\hat{V}_1) - H(\hat{V}_1 | X_1),$$

wherein I is an information function, H is an information entropy function or Shannon entropy, $X_1$ is the source data and $\hat{V}_1$ is the determined estimate of the source data, wherein the quantization technique operates within a constraint given by:

$$H(\hat{V}_1) \leq \frac{t'}{t} R,$$

wherein the transmission comprising the source data is received from the information source during a first time slot of duration t and the message comprising the determined estimate is transmitted towards the information destination during a second time slot of duration t', wherein t'=(1−t), wherein R is a data rate for the transmission from the apparatus towards the information destination.

25. The apparatus of claim 24, wherein the means for receiving comprises a receiver, the means for determining comprises a data processor and the means for transmitting comprises a transmitter.

26. The method of claim 1, wherein Q is a vector or matrix representing probabilities for input-output combinations from the quantization technique, wherein maximizing the objective function comprises obtaining a maximum from a reduced set of possibilities, wherein the reduced set of possibilities comprises first values of Q that satisfy $$H(\hat{V}_1) = \frac{t'}{t} R$$

and second values of Q that correspond to local maxima on a feasible set of actual thresholds.

27. The method of claim 26, wherein the reduced set of possibilities consists of the first values of Q and the second values of Q.

28. The method of claim 6, wherein the determined estimate enables the information destination to treat the determined estimate as outputs of an additive white Gaussian noise channel and combine the determined estimate with soft values received directly from the information source in a log-likelihood ratio domain.

29. The method of claim 28, wherein when combining the determined estimate with the soft values the information source takes into account at least one of quantization noise and channel noise.

* * * * *